(12) United States Patent
Cairns et al.

(10) Patent No.: US 6,271,783 B1
(45) Date of Patent: Aug. 7, 2001

(54) DIGITAL-TO-ANALOGUE CONVERTERS WITH MULTIPLE STEP MOVEMENT

(75) Inventors: Graham Andrew Cairns, Cutteslowe; Michael James Brownlow, Sandford on Thames, both of (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/264,917

(22) Filed: Mar. 9, 1999

(30) Foreign Application Priority Data

Mar. 14, 1998 (GB) ................................................ 9805354

(51) Int. Cl.⁷ .................................................... H03M 1/66
(52) U.S. Cl. ............................................ 341/144; 341/150
(58) Field of Search ................................... 341/153, 144, 341/150

(56) References Cited

U.S. PATENT DOCUMENTS

| 4,517,551 | 5/1985 | Campbell, Jr. ........................ 340/347 |
| 4,584,568 | 4/1986 | Zomorrodi ........................... 340/347 |

FOREIGN PATENT DOCUMENTS

| 0597315 | 5/1994 | (EP) . |
| 0600498 | 6/1994 | (EP) . |
| 1518482 | 7/1978 | (GB) . |
| 2022347 | 12/1979 | (GB) . |

OTHER PUBLICATIONS

Search Report for GB Application No. GB 9805354.9; Dated Apr. 14, 1998.

*Primary Examiner*—Peguy Jeanpierre
(74) *Attorney, Agent, or Firm*—Renner, Otto, Boisselle, Sklar

(57) ABSTRACT

The present invention relates to a digital-to-analog converter for converting a parallel digital input signal to a corresponding analogue output voltage, the digital-to-analogue comprising: an input arranged to receive said digital input signal; an output for outputting said corresponding analogue output voltage; and conversion means, operatively coupled to said input and said output, for moving said output voltage from a reference value to a first value and then subsequently back to said reference value, wherein the magnitude of said first value corresponds with the value of the said digital input signal, said output voltage is moved from said reference value to said first value in at least two steps via one or more intermediate values, and said output voltage is moved from said first value back to said reference value in at least two steps via one or more intermediate values.

23 Claims, 12 Drawing Sheets

( a ) COLUMN INVERSION

FIG. 3(a)
PRIOR ART ( b ) ROW INVERSION

FIG. 3(b)
PRIOR ART ( c ) PIXEL INVERSION

FIG. 3(c)
PRIOR ART

DIGITAL-TO-ANALOGUE CONVERTERS WITH MULTIPLE STEP MOVEMENT

TECHNICAL FIELD OF THE INVENTION

The invention relates to digital-to-analogue converters, and particularly, but not exclusively, to digital-to-analogue converters for use in controlling thin-film display panels such as thin film transistor based (TFT-based) active matrix liquid crystal displays (AMLCDs).

The invention can, for example, be used in the driver circuits of low-power display panels supplied with parallel RGB video data and which perform the task of digital-to-analogue (D/A) conversion, and in the driver circuits of digital portable equipment.

It is known to carry out so-called "quasi-adiabatic charging" in order to minimise the power associated with charging capacitive loads to particular voltage levels. Application of the scheme is mentioned in A. Chandrakasan and R. Brodersen. *Low Power Digital CMOS Design.* Kluwer Academic Publishers, 1995; and U.S. Pat. No. 5,473,526. The principle of quasi-adiabatic charging will now be briefly described.

DESCRIPTION OF THE RELATED ART

FIG. 1(a) shows a capacitor C and resistor R connected in series to two switches, $S_1$ and $S_2$. Assuming that the capacitor is initially discharged and that both $S_1$ and $S_2$ are open, both plates of the capacitor are grounded, and at a potential of zero. $S_1$ is connected to a voltage supply V. When $S_1$ is closed, the capacitor is charged to voltage V with time constant RC. When equilibrium is reached, the total charge that has flowed through the resistor and is now stored on the capacitor is CV. During the charging process, the voltage drop across the resistor varies from V to 0 volts, and has an average of V/2 (assuming the capacitance is linear). The energy dissipated in the resistor is therefore $CV^2/2$. When the capacitor is discharged, by opening $S_1$ and closing $S_2$, the same amount of energy is dissipated in the resistor. If the charging and discharging phases are performed at a frequency f, then the power dissipated in the resistor is equal to $CV^2 f$.

FIG. 1(b) shows the same RC load, this time connected to one of three reference voltages, V, V/2 and ground, by way of switches $S_1$, $S_2$ and $S_3$ respectively. Initially, the capacitor is discharged and all the switches are open. When $S_2$ is closed, the capacitor is charged to V/2 and the energy dissipated is $CV^2/8$. $S_2$ is then opened, and $S_1$ is closed, and a further $CV^2/8$ is dissipated. If, by controlling the operation of the switches, the capacitor is discharged to V/2 and then to ground, the extra energy consumed is $CV^2/4$. If the stepped charging and discharging phases are repeated at a frequency f, then the total power dissipation of the system is $CV^2 f/2$. This is half the amount of power compared with the system of FIG. 1(a).

When charging and discharging of the capacitor are each performed in N equal voltage steps, at a frequency f, the power consumption is $CV^2 f/N$. Indeed, in the limit of large N, an infinitesimally small current flows during each charging and discharging cycle, and no power is dissipated in the system, and the capacitor is then said to be charged and discharged adiabatically.

In this disclosure, stepped charging (and discharging) are referred to as quasi-adiabatic charging (and discharging). The technique of quasi-adiabatic charging clearly reduces the power dissipation. However it has found limited application because of the time penalty incurred by charging the load in steps. Furthermore, there is the extra overhead of reference voltages and switches (which, in reality, are themselves power consuming).

FIG. 2 shows a typical known active matrix display 10 comprising N rows and M columns of pixels 20, the like of which is described in A. Lewis and W. Turner. Driver circuits for AMLCDs. *Journal of the Society for Information Display,* pages 56–64, 1995. It is the combined function of the data line driver 14 and scan line driver 18 to provide analogue data voltages to the electrodes of the liquid crystal (LC) pixels. This is achieved for a single row of pixels as follows.

The data driver 14 'reads' a line of pixel data that is to be displayed and charges up the data lines 12 to the corresponding pixel voltage. The appropriate scan line 16 is activated so that the appropriate row of pixel TFTs 24 are switched on. The pixel TFTs 24 transfer charge from the data line 12 to the pixel storage capacitance until the voltage of each is the same. The scan line 16 is then de-activated and the row of pixel TFTs 24 return to their high impedance state. The above operation is repeated for each row of pixels 20 in the display 10.

Typical liquid crystal cells need to be driven by an AC voltage since ionic drift prevents DC voltages keeping the liquid crystal properly switched. AC driving of active matrices is usually achieved by one of the data line signals during successive image frames, while keeping the potential of the (opposing) common liquid crystal (LC) terminal constant. A second method involves reversing the common counter electrode potential and inverting the data line value during successive image frames. In order to prevent display flicker, during each frame, half of the pixels are driven by a voltage of positive polarity, and half of the pixels are driven by a voltage of negative polarity. FIG. 3 illustrates different ways of dividing the pixels into the two groups. In FIG. 3(a), column inversion is shown. Studies have shown that this scheme is not the best for reducing display flicker. See for example Y. Hirai and S. Kaneko. 13 inch EWS high resolution display with improved display quality by dot inversion drive. *Nikkei Micro-Device Flat Panel Display* 1993, pages 120–123, 1993. FIG. 3(b) shows row inversion which improves on the flicker problem, but introduces some cross-talk effects which result in image 'ghosting'. As concluded in the Hirai and Kaneko reference mentioned above, the best scheme for reducing both flicker and cross-talk is pixel inversion (also known as dot inversion), which is shown in FIG. 3(c).

Power consumption within the active matrix of AMLCD devices is associated with charging and discharging distributed capacitive loads (including TFT gate capacitance, pixel storage capacitance and parasitic substrate, overlap and fringe capacitance), through the data and gate lines which address the matrix. The power dissipated in the data and gate lines for a typical 10 inch diagonal XGA display with M×N=1024×768 pixels and a frame rate, f, of 60 Hz using row or pixel inversion, are computed below: Assuming a typical data line capacitance of 100 pF, and a typical data line transient voltage (assuming the liquid crystal (LC) is fully switched) of 8V (i.e.–4V to +4V), then the data line power consumption is given by:

$$P_{dl} = M \frac{cv^2}{2} fN = 1024 \times \frac{100 \times 10^{-12} \times 8^2}{2} \times 768 \times 60 = 151 \text{ mw}$$

Assuming a typical gate line capacitance of 200 pF, and a typical gate line transient voltage of 20V, then the gate line power consumption is given by:

$$P_{gf} = NCV^2 f = 768 \times 200 \times 10^{-12} \times 20^2 \times 60 = 3.68 \text{ mw}$$

Despite the higher capacitive load and voltage of the gate lines, the power dissipation associated with charging (and discharging) the data lines is clearly the most significant component. Convenient methods for reducing this power consumption are therefore desirable.

SUMMARY OF THE INVENTION

According to the invention there is provided a method of converting a digital input signal to a corresponding analogue output voltage, the method comprising the steps of receiving said digital input signal and moving said output voltage from a first value to a second value, wherein said second value corresponds with the value of said digital input signal and said output voltage is moved from said first value to said second value in at least two steps via one or more intermediate values.

An advantage of moving said output voltage in two or more steps, rather than a single step, is that if said output voltage is connected to a capacitive load, the capacitive load will be charged or discharged quasi-adiabatically.

A less obvious advantage of this invention, again when applied to active matrix data line driver circuitry, is improved picture quality. The improvement arises because the data lines no longer have fast-changing transient voltages and therefore crosstalk between the data lines is reduced.

In one embodiment of the invention the magnitudes of both said first and second values of said output voltage correspond with the value of said digital input signal, and said first and second values of said output voltage are of opposite polarity.

This embodiment of the invention is useful, for example, in a case where said output voltage is applied to a data line of an AMLCD.

In an alternative embodiment of the invention said first value of said output voltage corresponds to an immediately preceding value of said digital input signal, which immediately precedes said value of said digital input signal.

The invention also provides a digital-to-analogue converter arranged to carry out the above method, the digital-to-analogue converter comprising an input arranged to receive said digital input signal, an output for outputting said corresponding analogue output voltage, and conversion means for moving said output voltage from said first value to said second value.

Said input may comprise a plurality of binary-weighted capacitors.

The digital-to-analogue converter may further comprise an operational amplifier provided with a feedback capacitor, and the operational amplifier may change said output voltage in accordance with the quantity of charge transferred between said binary-weighted capacitors and said feedback capacitor.

Each binary-weighted capacitor may be connected to a reference voltage by a respective bit switch which is activated in accordance with the value of a corresponding bit of said digital input signal.

In this case, each bit switch is connected in series with one or more reference switches, themselves connected in parallel with each other, each reference switch being activated by an associated clock signal and controlling connection of the corresponding binary-weighted capacitor to said reference voltage.

Each binary-weighted capacitor may be connected to a second supply voltage by at least one second supply switch, each second supply switch being activated in accordance with an associated clock signal.

Said reference switches and second supply switches may be controlled by said clock signals in such a way that, for given fixed values of said reference and second supply voltages, and for a given position of each said bit switch, the charge on said feedback capacitor varies in a step-like manner between a first charge value and a second charge value, corresponding respectively to said first and second values of said output voltage, via a third charge value which lies intermediate said first and second charge values.

The most significant bit of said digital input signal may be represented by two or more capacitors arranged to be charged or discharged at different times in order to create said steps in said output voltage.

Said output voltage may be moved in said steps by charging or discharging the binary-weighted capacitor or capacitors corresponding to the most significant bit of said digital input signal at a different time from at least some of the other binary-weighted capacitors.

Said output voltage may be moved from said first value to said second value in n steps, and said binary-weighted capacitors may be controlled by n non-overlapping clock signals.

The invention also provides an active matrix liquid crystal display comprising a plurality of picture elements (pixels) each provided with a pixel electrode connected to a data line via a pixel switch, wherein said data line is connected to the output of a digital-to-analogue converter as described above.

BRIEF DESCRIPTION OF THE DRAWINGS

Preferred embodiments of the invention will now be described, by way of example only, with reference to the accompanying drawings, in which:

FIGS. 3(a), (b) and (c) show three prior art modes for changing the polarity of the LC pixels;

DETAILED DESCRIPTION OF THE INVENTION

Figure 1A:
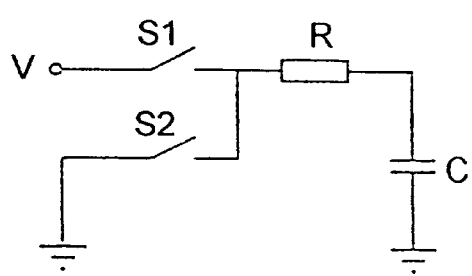
FIGS. 1(a) and (b) illustrate prior art circuits demonstrating the concept of quasi-adiabatic charging.
Figure 1B:
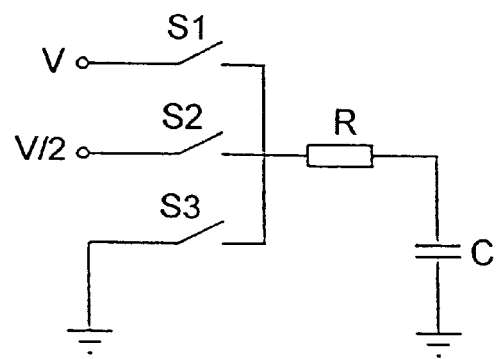
Figure 2:
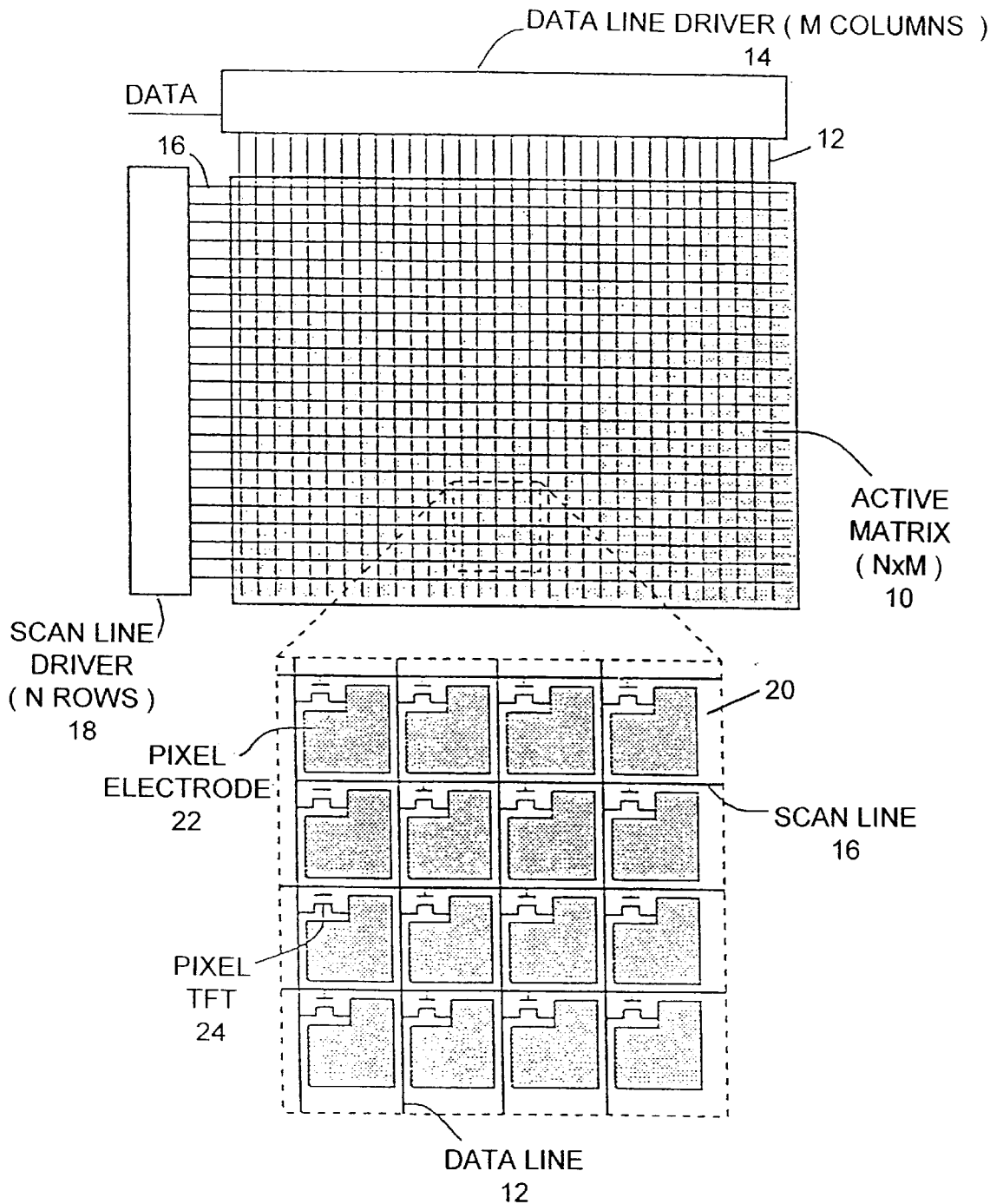
FIG. 2 shows a prior art active matrix LCD and associated drive components.
Figure 4:
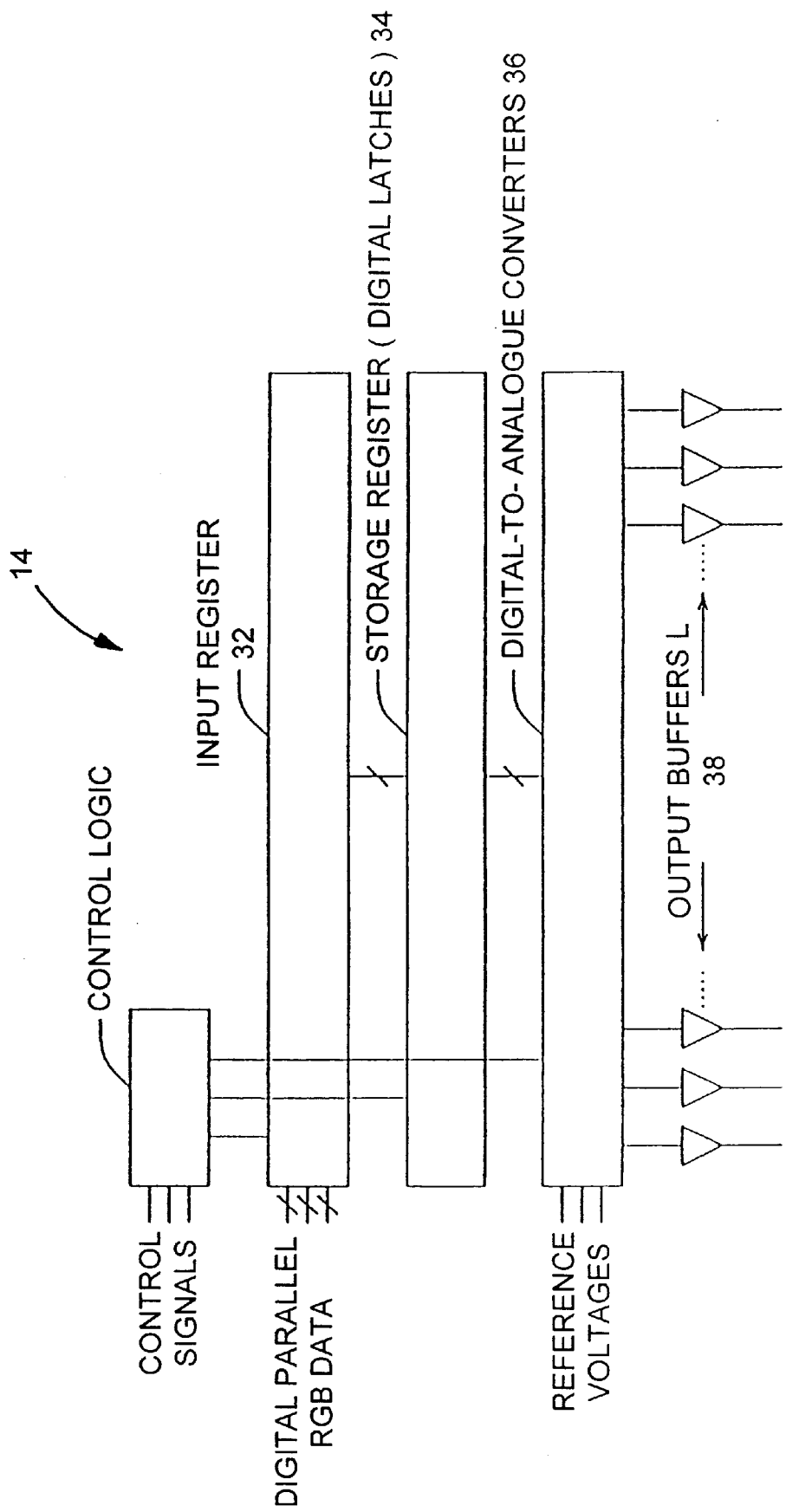
FIG. 4 shows the contents of a prior art line-at-a-time digital data driver used to charge the data lines of an active matrix display.

The contents of a typical prior art digital data driver 14 (refer to FIG. 2) are shown in FIG. 4. Digital driver schemes normally use line-at-a-time driving and thus contain two line memories, usually based on latches. Digital video data is typically communicated in n-bit parallel RGB format. As the data bits arrive, they are sampled by an input register 32. Once the whole line has been sampled and temporarily stored, the content of the input register 32 is transferred to another storage register 34. This register 32 is used to control digital-to-analogue converters 36.

The type of D/A converter used depends very much on the size and colour/grey-scale resolution of the active matrix. In the case of small screen displays, the D/A converters may connect directly to the data lines 12 (see FIG. 2), and charge them by simple charge sharing, but for higher performance displays they charge the data lines 12 through additional buffers 38. The D/A converters most commonly employed are parallel converters (based on binary-weighted capacitances (as described in Y. Matsueda, S. Inoue, S. Takenaka, T. Ozawa, S. Fujikawa, T. Nakazawa, and H. Ohshima. Low temperature poly-Si TFT-LCD with integrated 6-bit digital data drivers. *Society for Information Display 96 Digest,* pages 21–24, 1996), or voltages) and ramp converters.

Figure 5:
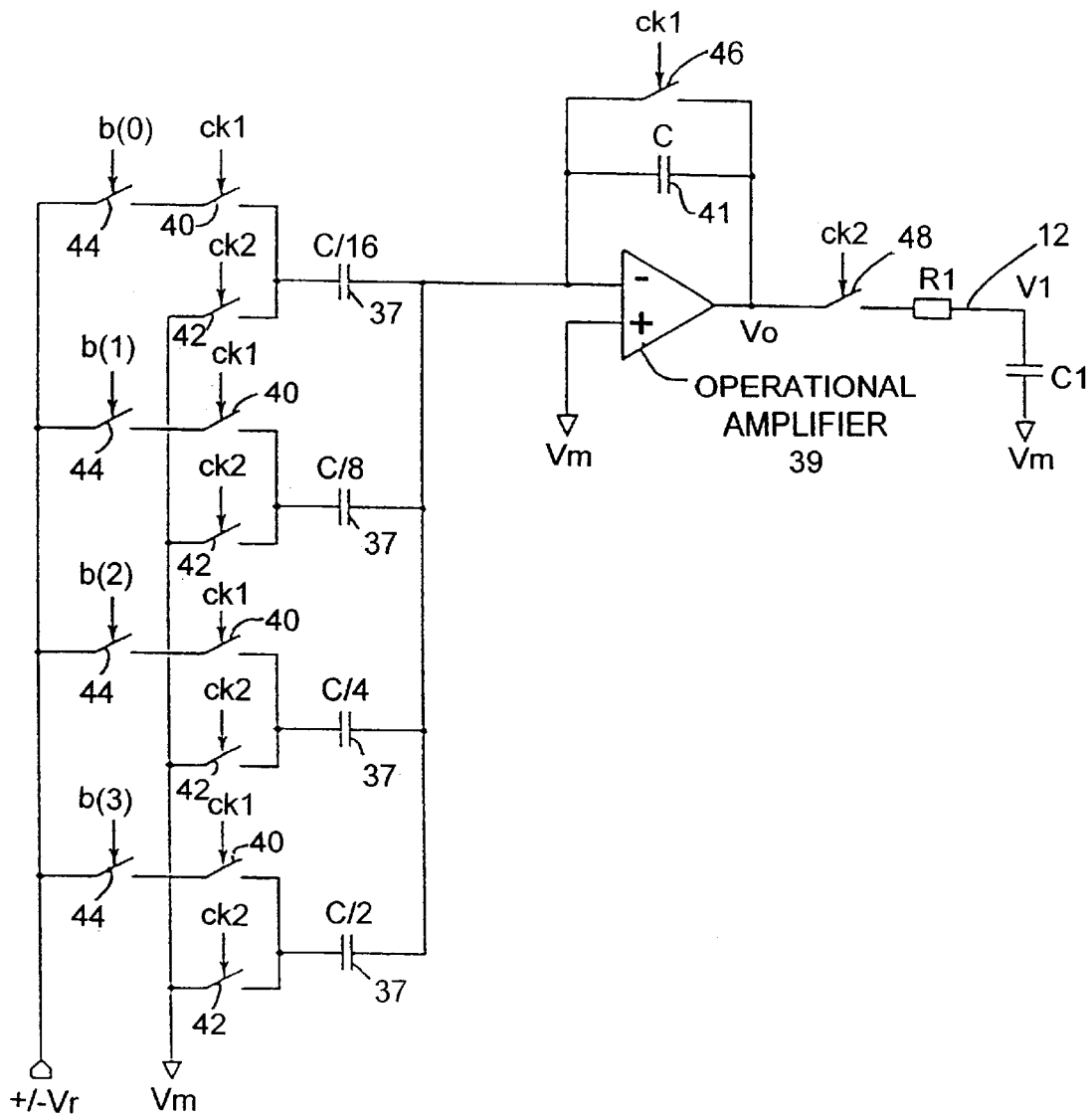
FIG. 5 shows a prior art charge-scaling digital-to-analogue (D/A) converter circuit which can be used in AMLCD digital data drivers.

FIG. 5 shows a prior art 4-bit charge-scaling D/A converter as disclosed in P. Allen and D. Holberg. *CMOS Analog Circuit Design.* Harcourt Brace Jovanovich College Publishers, 1987 and proposed for AMLCD driving in U.S. Pat. No. 5,453,757.

The circuit of FIG. 5 comprises four binary-weighted capacitors 37 having values C/2, C/4, C/8 and C/16 connected in parallel to the inverting input of an operational amplifier 39, the other input of which is connected to a voltage $v_m$, which may be ground. The digital input signal consists of four logic bits, represented in FIG. 5 as b(0) to b(3). A feedback capacitor 41 is connected between the output and the inverting input of the operational amplifier 39, as shown in FIG. 5. The left hand terminal of each binary-weighted capacitor 37 is connected to a reference voltage $v_r$ by a respective first switch 40 which is closed during a first clock pulse ck1, and to voltage $v_m$ by a second switch 42 which is closed during a second (non-overlapping) clock pulse ck2. In addition, each of said first switches 40 is connected in series with a respective digital bit switch 44 which is closed or open when the corresponding digital bit, b(0) to b(3), is at logic state "1" or "0" respectively.

Further switches 46 and 48 are provided for discharging the feedback capacitor 41 and connecting the output voltage $v_o$ of the operational amplifier to the load during clock pulses $ck_1$ and $ck_2$ respectively. The load resistance and capacitance are represented by R1 and C1. The circuit requires two-phase non-overlapping clock signals, $ck_1$ and $ck_2$, and performs conversion as follows. During $ck_1$, the feedback capacitor 41 of the operational amplifier 39 is discharged, as is the load capacitance c1. During the same clock phase, the left hand terminals of the binary-weighted capacitors 37 are selectively charged to voltage $v_r$ depending on the logic state of the digital bits, b(0) to b(3). During $ck_2$, the left hand terminals of the capacitors 37 are taken to potential $v_m$. This has the effect of transferring the charge stored on all the binary-weighted capacitors 37 onto feedback capacitor 41. By equating the total charge in the $ck_1$ and $ck_2$ phases it is simple to show that the voltage of the output of the operational amplifier 39, $v_o$, is as given below:

$$v_o = \frac{(v_r - v_m)}{16} \sum_{i=0}^{3} 2^i b(i)$$

The embodiments of the invention disclosed below are based on the type of D/A converter shown in FIG. 5.

Figure 7:
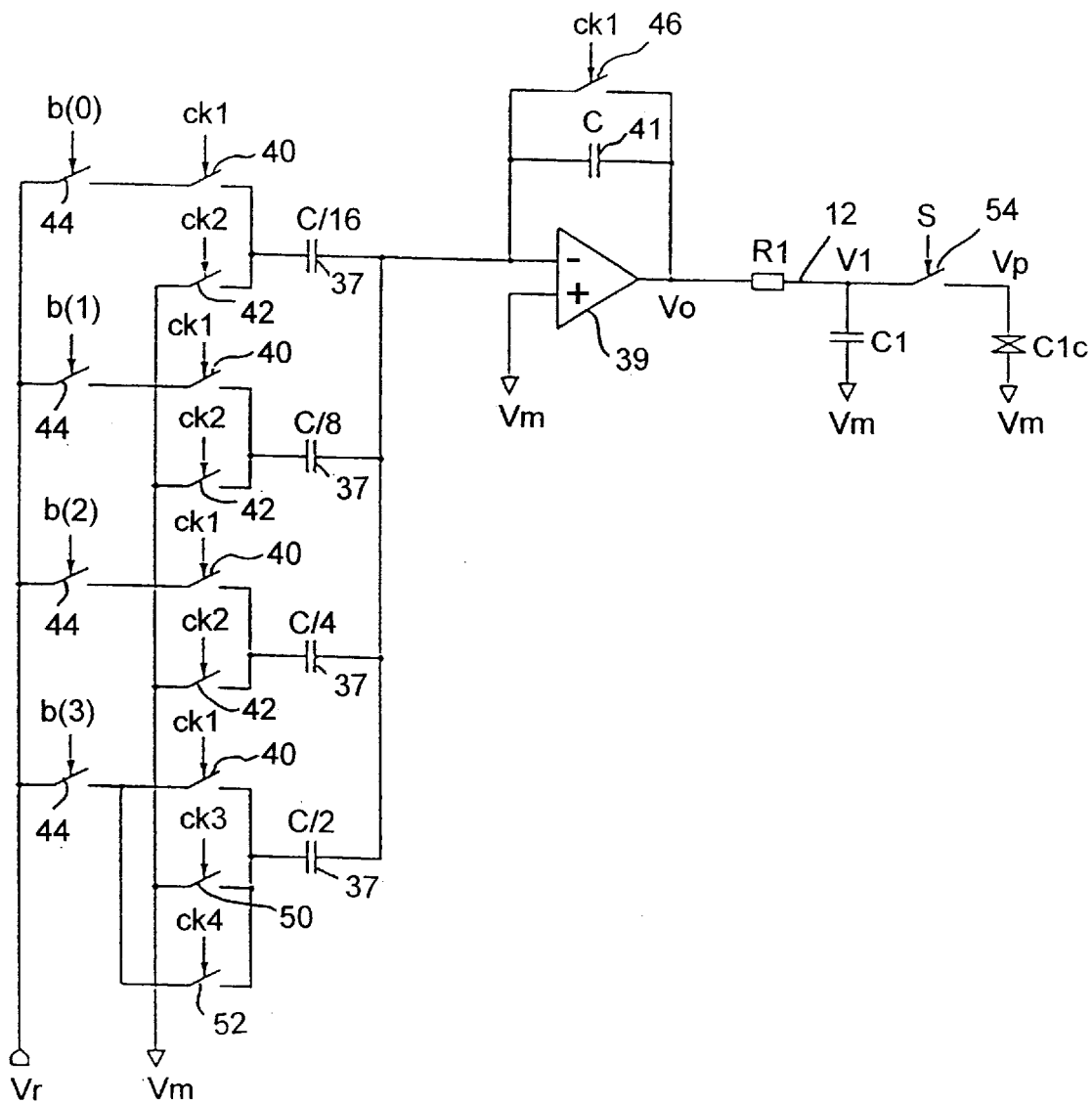
FIG. 7 shows a first embodiment of the invention, in the form of a 4-bit charge-scaling D/A converter which performs 2-step quasi-adiabatic data line charging and discharging.
Figure 10:
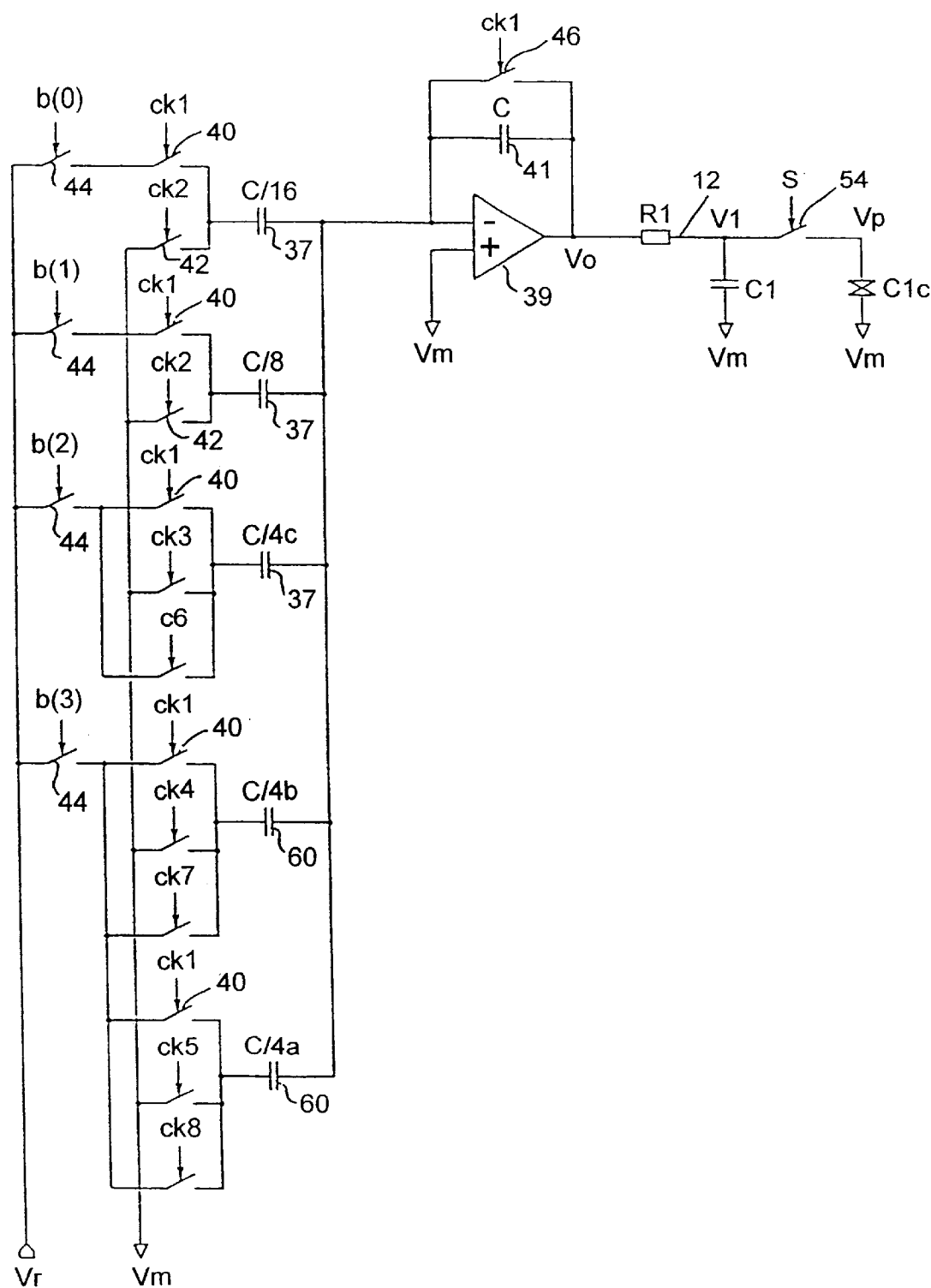
FIG. 10 shows a second embodiment of the invention in the form of a 4-bit charge-scaling D/A converter which performs 4-step quasi-adiabatic data line charging and discharging.

Before discussing the embodiments of the invention shown in FIGS. 7 and 10, the energy dissipated by the prior art D/A converter of FIG. 5 will be calculated to provide a benchmark power consumption estimate with which the circuits of FIGS. 7 and 10 can be compared.

The active matrix data line load is modelled as a simple lumped RC element as shown in FIG. 5. The load resistance R1 is simply equal to the resistance of the data line 12 (see FIG. 2). The load capacitance C1 arises from the data line parasitic capacitances (substrate, overlap with the scan lines, and fringe effects) as well as TFT gate-source overlap capacitances. A value of 100 pF is high, but not unreasonable, for a large high resolution display.

Figure 6A:
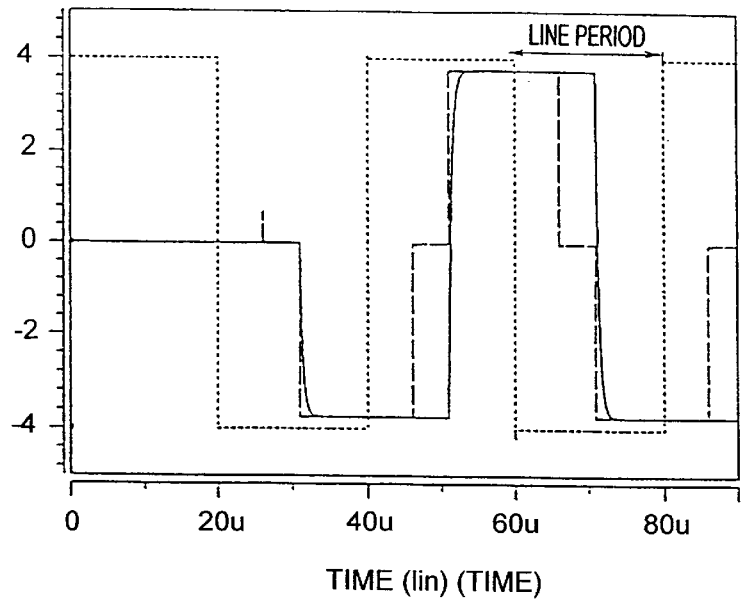
FIG. 6(a) shows the data line voltages of the prior art D/A converter of FIG. 5 when used to program pixels with voltages of ±3.75V.
Figure 6B:
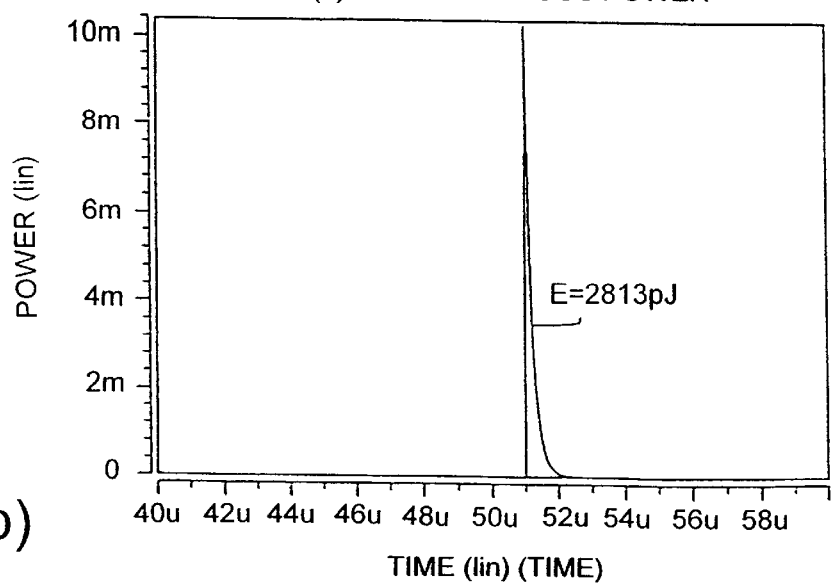
FIG. 6(b) shows the instantaneous power dissipation of the prior art D/A converter of FIG. 5 when used to program pixels with voltages of ±3.75V.

FIG. 6(a) shows the voltages for several points in the circuit of FIG. 5 during operation of the circuit. $v_r$ is the LC reference voltage, $v_o$ is the voltage at the output of the operational amplifier 39, and $v_1$ represents the data line voltage. The reference voltage $v_r$ alternates between +4V and −4V every line period (for row inversion or pixel inversion) and defines the full-scale D/A conversion limit. Assuming that all the input bits, b(0) to b(3), are set to 1, then the data line voltage swings between $(^{15}/_{16}) \times 4V = 3.75V$ and −3.75V each during successive line period. FIG. 6(b) shows the simulated power dissipated in the load resistance, R1, during one of these voltage transitions. The energy that is dissipated, and defined by the area under the power curve, is given by $$E = \tfrac{1}{2}CV^2 = \tfrac{1}{2}C1\,(2 \times (^{15}/_{16})v_r)^2 = 1.76 C1 v_r^2,$$

and has a value of 2813 pJ for $C_1 = 100$ pF and $v_r = 4V$. This implies that the 1024 data lines of an XGA display consume approximately $(2813 \times 10^{-12} \times 1024)/(20 \times 10^{-6}) = 144$ mW, given that the line period (ie. the interval at which $v_r$ changes) is 20 μs (see FIG. 6). Note that, in FIG. 5, the removal of the switch 48 which connects the operational amplifier 39 to the data line 12 means that the data line 12 is reset to voltage $v_m$ during the $ck_1$ phase. Data line charging thus takes place from the $v_m$ mid-point during each line period, and consequently, charging power is reduced. However, in many active matrix buffered D/A converters (possibly with very different circuit architectures) the data line 12 is not reset as a rule. It is therefore preferable to compare the power consumption of the embodiments of the invention with the power dissipation computed for the case where the data line switch 48 of FIG. 5 is in position.

Two embodiments of the invention are shown in FIGS. 7 and 10. It is assumed that both circuits are used for active matrix data line driving, which is the preferred application of the circuits, though the invention is not limited to this use. The first embodiment is a 4-bit D/A converter which incorporates 2-step quasi-adiabatic charging and discharging, and the second is a 4-bit, 4-step D/A converter. Note that the inventive concepts can be applied to a D/A converter of any resolution (ie. using any number of bits or steps).

FIG. 7 shows the first embodiment of the invention. It is a 4-bit charge-scaling D/A converter which charges and discharges a load capacitance in two steps. Parts of the circuit of FIG. 7 corresponding to like parts in the circuit of FIG. 5 have been given the same reference numerals. The binary-weighted capacitor array, comprising four binary-weighted capacitors 37 and a plurality of switches 40, 42, 44, 50 and 52, is similar to that shown in FIG. 5. The major difference concerns the switches connected to the most-significant-bit (MSB) capacitor 37 of value C/2. Like the smaller capacitors 37 in the array, this capacitor is connected to reference voltage $v_r$ via two series-connected switches 44 and 40 which, in this case, are controlled by the MSB logic bit b(3), and the clock pulse $ck_1$. These switches 44 and 40 ensure that during clock phase $ck_1$, the left hand side capacitor plate of the MSB capacitor C/2 is raised to potential $v_r$ if the logic state of b(3) is high. The left hand terminal of the MSB capacitor C/2 is also connected to $v_m$ by a third switch 50 controlled by $ck_3$. This switch 50 allows the left hand terminal of C/2 to be connected to potential $v_m$, which means that any charge that is on the capacitor is transferred to the feedback capacitor 41 during the third clock pulse $ck_3$. $v_r$ can also be connected to the left hand terminal of the MSB capacitor C/2 by the action of the b(3) data signal in conjunction with a fourth switch 52 controlled by a fourth clock pulse $ck_4$. Also shown in FIG. 7 is a scan switch 54 which represents the pixel TFT (see FIG. 2), and which is controlled by a scan signal S; and an additional load capacitance Clc which represents the pixel storage capacitance.

Figure 8:
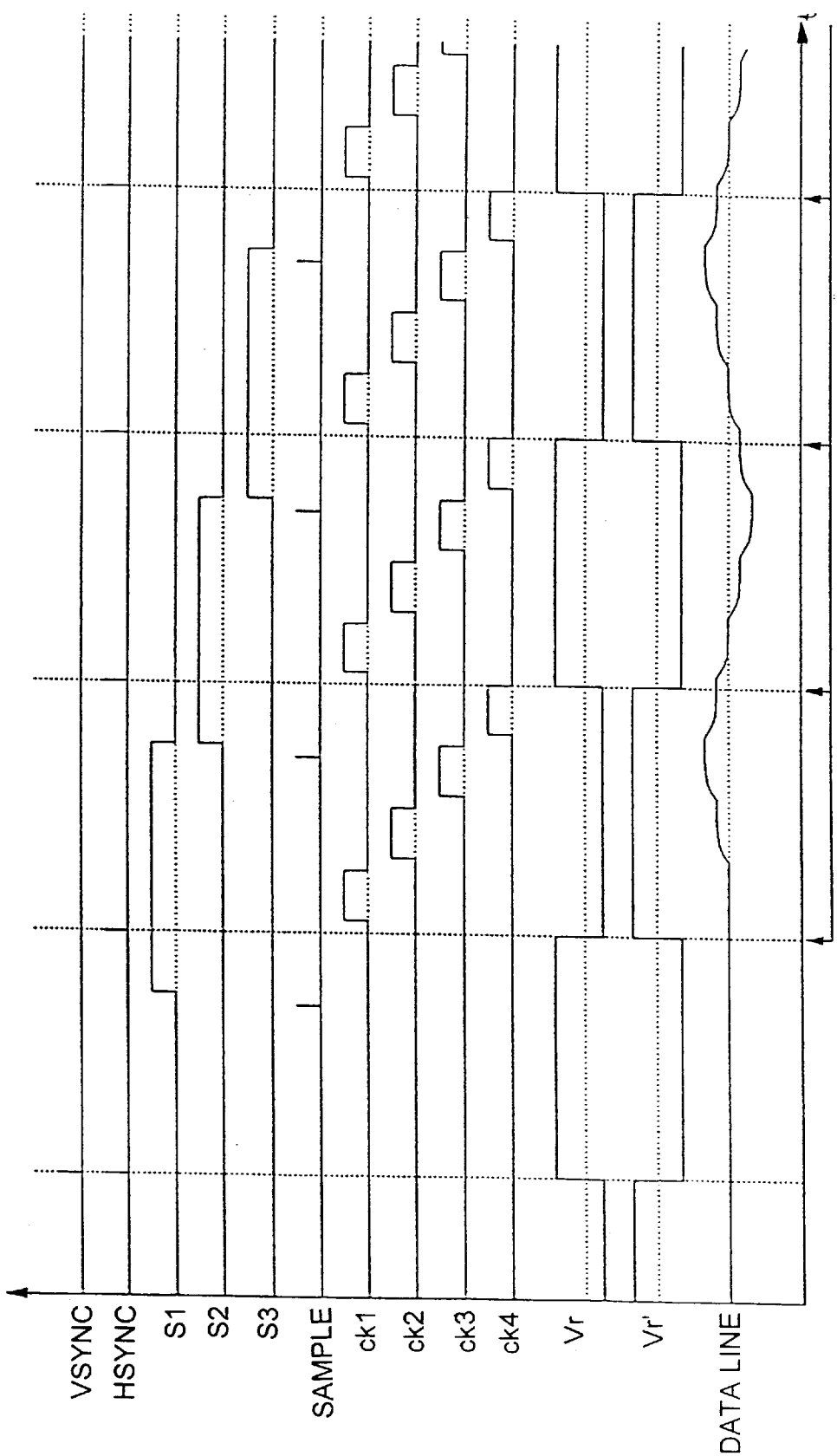
FIG. 8 shows the timing of four clock signals (with respect to the other standard active matrix signals) used in said first embodiment.

Operation of the D/A converter of FIG. 7 requires 4 non-overlapping clock signals in total ($ck_1$ to $ck_4$), shown in FIG. 8. FIG. 8 also shows the timing of the other signals involved in the operation of the circuit, and these signals are discussed below. The operation of the D/A converter of FIG. 7 proceeds as follows for a full-scale conversion (that is, all four input logic bits equal to logic state "1", represented hereinafter as b(0:3)="1111").

During clock phase $ck_1$, the binary-weighted capacitors 37 are selectively charged to voltage $v_r-v_m$. Since all of the input data bits (b(0) to b(3)) are high in this case, all of the capacitors 37 are charged. Simultaneously, the terminals of the feedback capacitor 41 of the operational amplifier 39 are shorted, which results in the data line potential $v_1$ changing to voltage $v_m$ (since the output voltage $v_o$ of the operational amplifier 39 becomes $v_m$).

During clock phase $ck_2$, the left hand terminals of capacitors C/4, C/8 and C/16 are connected to $v_m$. Consequently, their combined charge is transferred to the feedback capacitor 41, and because of the relative capacitor sizes, $v_o$ (the output voltage of the operational amplifier 39) becomes $\frac{7}{16}(v_r-v_m)$ Volts. This follows from the formula for $v_o$ given above. (Although b(0:3)="1111", only the first three capacitors are discharged during $ck_2$, so for the purposes of the formula we can consider b(0:3)="1110"). The data line voltage $v_1$ follows the output voltage $v_o$, although it is delayed by time constant R1(C1+Clc). This is the first data line charging step.

When $ck_3$ is high, the left hand terminal of the MSB capacitor C/2 is connected to $v_m$. This causes extra charge to be shunted onto the feedback capacitor 41 and causes the output voltage $v_o$ of the operational amplifier 39 to change to $\frac{15}{16}(v_r-v_m)$ Volts. This is the second charging step, and the data line voltage $v_1$ follows this new output level.

During the above first three clock phases, the scan line signal, S, is active (ie. switch 54 is closed) so that the voltage $v_p$ across the pixel capacitance Clc simply duplicates the data line voltage, $v_l$. The next important step is the transition of the scan signal S, thus opening switch 54 so that the pixel storage capacitance Clc latches the data line voltage $v_l$ before it begins to be discharged.

When the fourth clock pulse $ck_4$ goes high, the left hand terminal of the MSB capacitor C/2 is again connected to the $v_r$ signal. This causes an amount of charge (equal to C/2 $(v_r-v_m)$) to be 'pulled' from the feedback capacitor 41 back onto the MSB capacitor C/2 (as the most significant bit b(3) is still high). The output voltage $v_o$ falls back to $\frac{7}{16}(v_r-v_m)$ Volts, and the data line is discharged by $\frac{1}{2}(v_r-v_m)$ Volts. This is the first discharging step.

When $ck_1$ goes high again, the binary-weighted capacitors 37 are charged to the opposite polarity. Furthermore, the shorting of the feedback capacitor 41 during clock phase $ck_1$ ensures that the second data line discharging step is completed before the data line is charged to the opposite polarity. The above sequence of operations is repeated with the opposite polarity reference voltage $v_{r^*}$ (see FIG. 8) during the next line period.

FIG. 8 shows the timing of the control signals. The VSYNC and HSYNC pulses signify the beginning of frame and line periods, respectively. $S_1$, $S_2$ and $S_3$ are the scan signals of the first, second and third scan lines (ie. the signals controlling the switches 54 of each data line). The SAMPLE signal merely indicates when the data for the column driver of the D/A converter in question is transmitted (and therefore sampled by the input register—see FIG. 4). It is clear that the column driver signal SAMPLE is located approximately $\frac{2}{3}$ of the way along the data driver period. Clock signals $ck_1$ to $ck_4$ are the 4-phase non-overlapping clock signals which control the operation of all of the D/A converters in the data driver 14. $v_r$ is the reference voltage for the D/A converter and changes at line time frequency for row inversion of the LC pixels, as described above. For pixel inversion, the complementary $v_{r^*}$ signal is also required and it is routed to every other column driver in place of the reference voltage $v_r$.

The scan line signals, ($S_1$, $S_2$, $S_3$ etc), reference voltages ($v_r$, $v_{r^*}$), clock signals ($ck_1$ to $ck_4$) and data bit signals (b(0) to b(3)) require careful coordination. The first constraint is that the data bits from the input register 32 must be transferred to the storage register 34 at the end of the line time, as marked at the bottom of FIG. 8, and following this, clock signals $ck_1$, $ck_2$, $ck_3$ and $ck_4$ are all active within this line period. It can also be seen that the scan line signals ($S_1$, $S_2$, $S_3$) are brought forward one clock phase period (in comparison to the usual line-at-a-time scan signals) in order that the scan signals fall and latch the data line voltage before the fourth clock phase, $ck_4$. This is important because, as described above, the pixel storage capacitance Clc must be disconnected from the data line voltage $v_l$ (by opening switch 54—ie by switching off the TFT represented by switch 54) while the data line voltage $v_l$ is at its peak value, (achieved during clock pulse $ck_3$), and before the first discharging step occurring during the fourth clock pulse $ck_4$.

The generation of the clock signals $ck_1$ to $ck_4$ can be achieved with a distributed shift register controller, such as described in British Patent Application No. 9706941.3. This is particularly convenient for monolithically-integrated data drivers which are implemented on the same substrate as the display transistors.

Figure 9A:
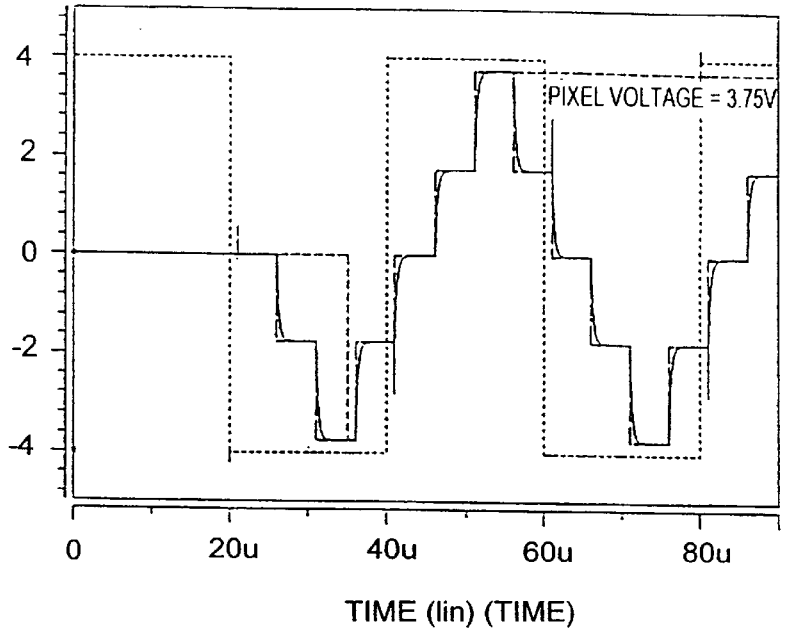
FIG. 9(a) shows stepped data line charging and discharging for full-scale LC switching using the D/A converter of said first embodiment.

FIG. 9(a) displays simulation traces of the voltages $v_l$, $v_o$, $v_p$ and $v_r$ shown in FIG. 7. In this simulation $v_m=0V$. The line time (ie. the interval at which $v_r$ changes) in this simulation is 20 $\mu s$—typical of XGA displays. The 2-step data line charging and discharging can clearly be seen on the $v_l$ trace. The dataline voltage $v_l$ lags $v_o$ slightly because of the time constant R1 (C1+Clc) mentioned above. The falling edge of scan signal $S_2$ (not shown) occurs at 35 $\mu s$ and latches the data line voltage $v_l$ onto the pixel storage capacitor Clc, which is shown in FIG. 9(a) by the pixel voltage $v_p$ being latched at 3.75V (ie. $^{15}/_{16}(v_r-v_m)$).

Figure 9B:
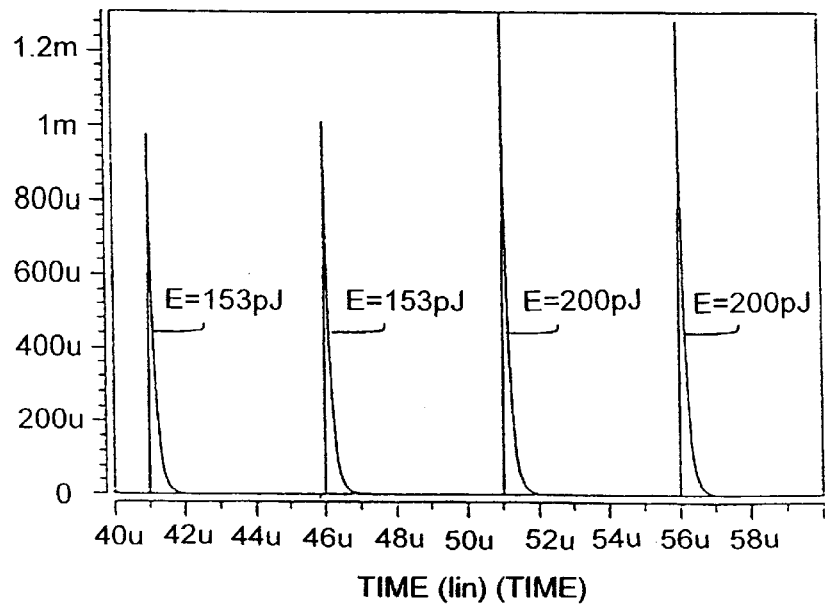
FIG. 9(b) shows the instantaneous power dissipation in the lumped data line resistance, R1, of the data line.

FIG. 9(b) shows the simulated power dissipated in resistor R1 during the line period between 40 $\mu s$ and 60 $\mu s$ (refer to FIG. 9(a)). Within this period, the first power transient is associated with a discharging step, the following two are charging power transients, and the fourth is a discharging transient. The total energy that is dissipated is $$E=\tfrac{1}{2}CV^2=\tfrac{1}{2}C1((\tfrac{7}{16}v_r)^2+(\tfrac{7}{16}v_r)^2+(\tfrac{1}{2}v_r)^2+(\tfrac{1}{2}v_r)^2)=0.441C1v_r^2$$

This figure compares favourably with the benchmark figure of $1.76C1v_r^2$ calculated above. Assuming the values of $C1=100$ pF and $v_r=4V$ given above, and a line period of 20 $\mu s$, then E=706 pJ, and the power dissipated in the 1024 data lines of an XGA display employing the D/A converter of FIG. 7 would fall by a similar factor to approximately $(706\times 10^{-12}\times 1024)/(20\times 10^{-6})=36.1$ mW.

FIG. 10 shows the second embodiment of the invention, in the form of a similar 4-bit D/A converter, in which the circuit has been extended to implement 4-step quasi-adiabatic data line charging and discharging. Parts of the D/A converter of FIG. 10 corresponding to similar parts of the D/A converter of FIG. 7 are represented by the same reference numerals. Since the MSB capacitor (C/2) in the binary-weighted capacitor array of the charge-scaling D/A converter of FIG. 7 is responsible for the greatest portion of voltage change at the converter output, in the embodiment of FIG. 10, the MSB capacitor (C/2 in FIG. 7) is divided into two half-size MSB capacitors 60 each of capacitance C/4 (labelled C/4a and C/4b in FIG. 10 for clarity). The remaining binary-weighted capacitors 37 have capacitances of C/4, C/8 and C/16 as before, the C/4 capacitor being labelled C/4c in FIG. 10 for clarity. Each half-size MSB capacitor 60 can independently shunt its charge to and from the operational amplifier feedback capacitor 41. This is achieved by the additional clock control signals $ck_4$, $ck_5$, $ck_7$ and $ck_8$. The second most-significant-bit capacitor, also of size C/4 (and labelled C/4c in FIG. 10), can also be independently controlled with clock signals $ck_3$ and $ck_6$. The circuit operates on the same circuit principles as described above in relation to the first embodiment of FIG. 7, but requires a total of 8 non-overlapping clock signals of line time frequency, $ck_1$ to $ck_8$. For a full-scale conversion with data bits b(0:3)= "1111", the voltage $v_o$ at the output of the operational amplifier 39 is shown during each clock phase in the following table:

| Clock phase | Amplifier output voltage, $v_o$ |
|---|---|
| $ck_1$ | $v_m$ |
| $ck_2$ | $^{3}/_{16}(v_r-v_m)$ |
| $ck_3$ | $^{7}/_{16}(v_r-v_m)$ |
| $ck_4$ | $^{11}/_{16}(v_r-v_m)$ |
| $ck_5$ | $^{15}/_{16}(v_r-v_m)$ |
| $ck_6$ | $^{11}/_{16}(v_r-v_m)$ |
| $ck_7$ | $^{7}/_{16}(v_r-v_m)$ |
| $ck_8$ | $^{3}/_{16}(v_r-v_m)$ |
| $ck_1$ | $v_m$ |

Figure 11:
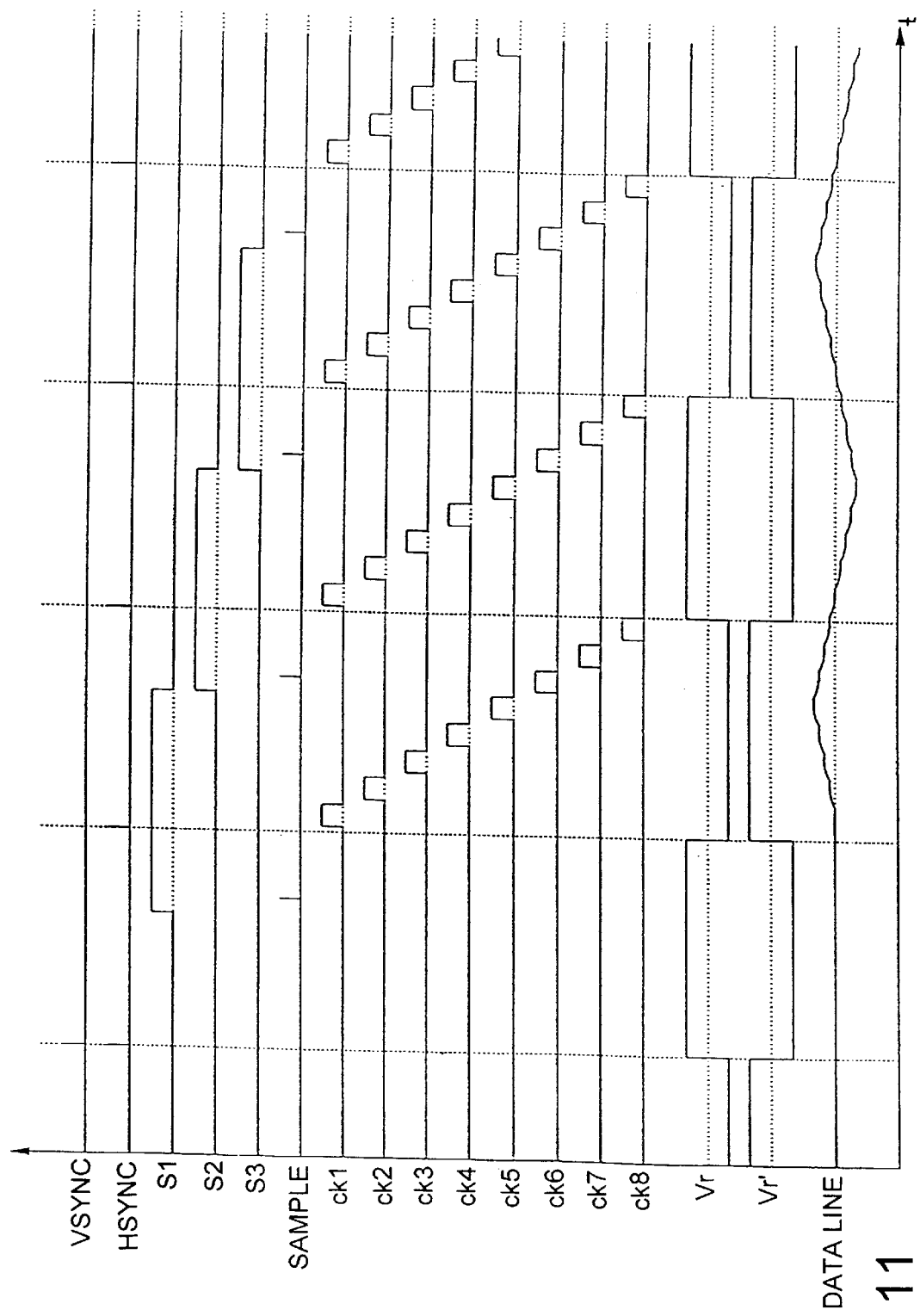
FIG. 11 shows the timing of eight clock signals (with respect to the other standard active matrix signals) used by said second embodiment.

Starting from the mid-point voltage, $v_m$, it can be seen that the data line is charged in four steps to the required data voltage ($^{15}/_{16}(v_r-v_m)$), before being discharged in a further four steps back to $v_m$. The timing diagram shown in FIG. 11 illustrates how the multi-phase clock pulses $ck_1$ to $ck_8$, reference voltages $v_r$ and $v_{r*}$, and scan signals $S_1$, $S_2$ and $S_3$ are synchronised.

Figure 12A:
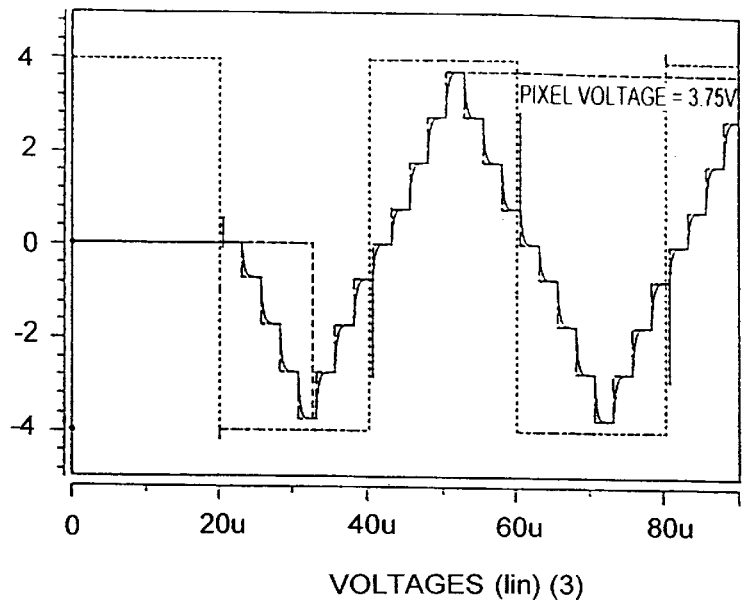
FIG. 12(a) shows the stepped data line charging and discharging for full-scale LC switching using said second embodiment.

FIG. 12(a) shows simulation results for the circuit voltages. It can be seen that the reference voltage $v_r$ alternates between +4V and −4V during each scan line period. The data line voltage $v_l$ follows the output voltage $v_o$ with time constant lag R1(C1+Clc). The pixel voltage $v_p$ is latched onto the pixel storage capacitor Clc when the data line is fully charged (to 3.75V). The latching instant is controlled by the scan signals $S_1$, $S_2$ and $S_3$ in the same way as in FIG. 7.

Figure 12B:
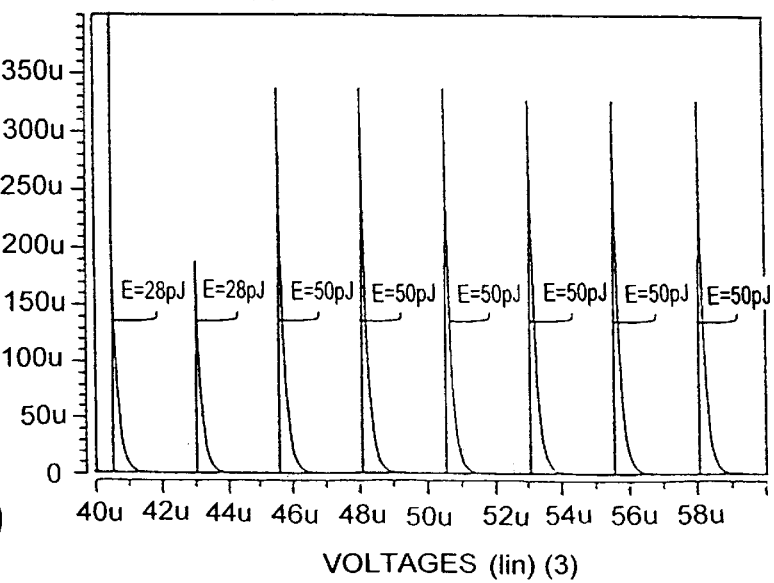
FIG. 12(b) shows the instantaneous power dissipation in the lumped data line resistance, R1.

The power dissipated in the load resistor R1 is shown in FIG. 12(b). The total energy expended during the line time is equal to $$E=\tfrac{1}{2}CV^2=\tfrac{1}{2}C1((\tfrac{3}{16})^2+(\tfrac{3}{16})^2+(\tfrac{1}{4})^2+(\tfrac{1}{4})^2+(\tfrac{1}{4})^2+(\tfrac{1}{4})^2+(\tfrac{1}{4})^2+(\tfrac{1}{4})^2)v_r^2=0.222C1v_r^2$$

This figure is a factor of 8 smaller than the benchmark calculated previously and would ensure that the data line power dissipation would be smaller than 18.2 mW for a typical XGA display.

Embodiments of the invention incorporating higher bit D/A converters can be provided by applying the above principles to the capacitor of the MSB, or the capacitors of the MSBs, in the binary-weighted capacitor array. The 4-step D/A converter of FIG. 10 can, for example, be turned into a 6-bit converter simply by adding capacitors of size C/32 and C/64 and switches (controlled by signals $ck_1$ and $ck_2$, and two LSB data bits) to the binary-weighted capacitor array.

Furthermore, whilst the specific embodiments discussed above relate to D/A converters which provide an alternating output voltage which varies between output values of opposite polarity, the invention is also applicable to D/A converters which provide a steady output voltage which varies only when the digital input signal changes. In such a case, when the digital input signal changes in value, the output voltage changes to the corresponding new value in a least two steps in order to achieve quasi-adiabatic charging or discharging of the load.

The invention includes within its scope a digital-to-analogue (D/A) converter circuit (more specifically, a charge scaling parallel D/A converter circuit) controlled by 2 k non-overlapping clock signals which govern the switching of the circuit's binary weighted capacitors. The use of such clock signals makes it possible to charge and discharge a capacitive (RC) load in k steps in a quasi-adiabatic process, resulting in a reduced total power consumption (which may be the total power drawn from a supply voltage of an output buffer).

Such a D/A converter circuit is particularly advantageous for a system having a large capacitive load which is required to be charged/discharged at a relatively low frequency. For example, when the D/A converter circuit is used in a digital data driver of an active matrix liquid crystal display apparatus in an addressing scheme such as the row inversion scheme or the pixel inversion scheme, the total power dissipated in the data line resistors is reduced by a factor of k.

What is claimed is:

1. A digital-to-analogue converter for converting a parallel digital input signal to a corresponding analogue output voltage, comprising:

an input arranged to receive said digital input signal;

an output for outputting said corresponding analogue output voltage; and conversion means, operatively coupled to said input and said output, for moving said output voltage from a reference value to a first value and then subsequently back to said reference value, wherein the magnitude of said first value corresponds with the value of the said digital input signal, said output voltage is moved from said reference value to said first value in a plurality of voltage steps between said reference value and the magnitude of said first value, and said output voltage is moved from said first value back to said reference value in a plurality of voltage steps between the magnitude of said first value and said reference value.

2. A digital-to-analogue converter as claimed in claim 1, wherein the conversion means further functions to subsequently move said output voltage from said reference value to a second value and then back to said reference value, wherein the magnitude of said second value corresponds with said value of said digital input signal or a subsequent value of said digital input signal, and said second value is, with respect to said reference value, of opposite polarity to said first value, and wherein said output voltage is moved from said reference value to said second value in at least two steps via one or more intermediate values, and said output voltage is moved from said second value back to said reference value in at least two steps via one or more intermediate values.

3. A digital-to-analogue converter as claimed in claim 2, wherein the conversion means repeats the process of moving said output voltage between said first, second and reference values a plurality of times for different values of said digital input signal.

4. A digital-to-analogue converter as claimed in claim 1, wherein said reference value of said output voltage is ground.

5. A digital-to-analogue converter as claimed in claim 1, wherein said input comprises a plurality of binary-weighted capacitors.

6. A digital-to-analogue converter as claimed in claim 5, wherein the most significant bit of said digital input signal is represented by two or more capacitors arranged to be charged or discharged at different times in order to create said steps in said output voltage.

7. A digital-to-analogue converter as claimed in claim 5, in which said output voltage is moved in said steps by charging or discharging the binary-weighted capacitor or capacitors corresponding to the most significant bit of said digital input signal at a different time from at least some of the other binary-weighted capacitors.

8. A digital-to-analogue converter as claimed in claim 5, wherein said output voltage is moved from said first value to said a second value in n steps, and said binary-weighted capacitors are controlled by n non-overlapping clock signals.

9. A digital-to-analogue converter as claimed in claim 5, wherein the conversion means comprises an operational amplifier provided with a feedback capacitor, wherein the operational amplifier changes said output voltage in accordance with the quantity of charge transferred between said binary-weighted capacitors and said feedback capacitor.

10. A digital-to-analogue converter as claimed in claim 9, wherein each binary-weighted capacitor is connected to a reference voltage by a respective bit switch which is activated in accordance with the value of a corresponding bit of said digital input signal.

11. A digital-to-analogue converter as claimed in claim 10, wherein each bit switch is connected in series with one or more reference switches, themselves connected in parallel with each other, each reference switch being activated by an associated clock signal and controlling connection of the corresponding binary-weighted capacitor to said reference voltage.

12. A digital-to-analogue converter as claimed in claim 5, wherein each binary-weighted capacitor is connected to a reference voltage by a respective bit switch which is activated in accordance with the value of a corresponding bit of said digital input signal.

13. A digital-to-analogue converter as claimed in claim 12, wherein each bit switch is connected in series with one or more reference switches, themselves connected in parallel with each other, each reference switch being activated by an associated clock signal and controlling connection of the corresponding binary-weighted capacitor to said reference voltage.

14. A digital-to-analogue converter as claimed in claim 13, wherein each binary-weighted capacitor is connected to a second supply voltage by at least one second supply switch, each second supply switch being activated in accordance with an associated clock signal.

15. A digital-to-analogue converter as claimed in claim 14, wherein said reference switches and second supply switches are controlled by said clock signals in such a way that, for given fixed values of said reference and second supply voltages, and for a given position of each said bit switch, the charge on said feedback capacitor varies in a step-like manner between a first charge value and a second charge value, corresponding respectively to said reference and first values of said output voltage, via a third charge value which lies intermediate said first and second charge values.

16. A digital-to-analogue converter as claimed in claim 5, wherein each binary-weighted capacitor is connected to a second supply voltage by at least one second supply switch, each second supply switch being activated in accordance with an associated clock signal.

17. A method of converting a parallel digital input signal to a corresponding analogue output voltage, the method comprising the steps of:

receiving said digital input signal; and moving said output voltage from a reference value to a first value and then subsequently back to said reference value, wherein the magnitude of said first value corresponds with the value of the said digital input signal, said output voltage is moved from said reference value to said first value a plurality of voltage steps between said reference value and the magnitude of said first value, and said output voltage is moved from said first value back to said reference value in a plurality of voltage steps between the magnitude of said first value and said reference value.

18. A method as claimed in claim 17, which further comprises the steps of:

subsequently moving said output voltage from said reference value to a second value and then back to said reference value, wherein the magnitude of said second value corresponds with said value of said digital input signal or a subsequent value of said digital input signal, and said second value is, with respect to said reference value, of opposite polarity to said first value, and wherein said output voltage is moved from said reference value to said second value in a plurality of voltage steps between said reference value and the magnitude of said second value, and said output voltage is moved from said second value back to said reference value in a plurality of voltage steps between said reference value and the magnitude of said second value.

19. A method as claimed in claim 18, wherein said steps of moving said output voltage between said first, second and reference values are repeated a plurality of times for different values of said digital input signal.

20. A method as claimed in claim 19, wherein said reference value of said output voltage is ground.

21. A method as claimed in claim 18, wherein said reference value of said output voltage is ground.

22. A method as claimed in claim 17, wherein said reference value of said output voltage is ground.

23. An active matrix liquid crystal display comprising:

a plurality of picture elements (pixels) each provided with a pixel electrode connected to a data line via a pixel switch, and wherein each said data line is connected to the output of a digital-to-analogue converter for converting a parallel digital input signal to a corresponding analogue output voltage, each digital-to-analogue converter comprising:

an input arranged to receive said digital input signal;

an output for outputting said corresponding analogue output voltage; and conversion means, operatively coupled to said input and said output, for moving said output voltage from a reference value to a first value and then subsequently back to said reference value, wherein the magnitude of said first value corresponds with the value of the said digital input signal, said output voltage is moved from said reference value to said first value in a plurality of voltage steps between said reference value and the magnitude of said first value, and said output voltage is moved from said first value back to said reference value in a plurality of voltage steps between the magnitude of said first value and said reference value.

* * * * *